(12) United States Patent
Ning et al.

(10) Patent No.: US 8,350,558 B2
(45) Date of Patent: Jan. 8, 2013

(54) SYSTEM AND METHOD FOR MEASURING REACTIVE POWER

(75) Inventors: Yun [Yale] Ning, Beijing (CN); Xiuhong [George] Lu, Beijing (CN)

(73) Assignee: Analog Devices, Inc., Norwood, MA (US)

( * ) Notice: Subject to any disclaimer, the term of this patent is extended or adjusted under 35 U.S.C. 154(b) by 668 days.

(21) Appl. No.: 12/473,166

(22) Filed: May 27, 2009

(65) Prior Publication Data

US 2010/0085037 A1 Apr. 8, 2010

Related U.S. Application Data

(60) Provisional application No. 61/102,523, filed on Oct. 3, 2008.

(51) Int. Cl.
*G01R 5/14* (2006.01)
*G01R 5/16* (2006.01)
*G01R 13/00* (2006.01)
(52) U.S. Cl. .............. 324/140 R; 324/141; 324/142
(58) Field of Classification Search ...... 324/103 R–142; 702/57–60
See application file for complete search history.

(56) References Cited

U.S. PATENT DOCUMENTS

| 4,580,102 | A | * | 4/1986 | Myers .................... 331/17 |
| 5,243,536 | A | * | 9/1993 | Bradford .................. 702/60 |
| 5,721,424 | A | * | 2/1998 | Price .................... 250/214 R |
| 5,732,004 | A | * | 3/1998 | Brown .................... 708/319 |
| 6,014,021 | A | * | 1/2000 | Le Van Suu ............ 324/142 |
| 7,050,419 | B2 | * | 5/2006 | Azenkot et al. ......... 370/347 |
| 2002/0060996 | A1 | * | 5/2002 | Kwak et al. ............ 370/335 |
| 2004/0004515 | A1 | * | 1/2004 | Takahashi et al. ....... 329/304 |

FOREIGN PATENT DOCUMENTS

| DE | 2828329 A1 | 1/1980 |
| JP | 54066743 A | 5/1979 |

OTHER PUBLICATIONS

PCT International Search Report for related International Application No. PCT/US2009/058784; Dated: Feb. 2, 2010.
Branislav V Djokic et al.: "Two Methods for Improved Measurements of Reactive Power and Reactive Energy Insensitive to Frequency Variations", IEEE Transactions on Instrumentation and Measurement, IEEE Service Center, Piscataway, NJ, US, vol. 47, No. 1, Feb. 1, 1998.

* cited by examiner

*Primary Examiner* — Vinh Nguyen
*Assistant Examiner* — Alesa Allgood
(74) *Attorney, Agent, or Firm* — Kenyon & Kenyon LLP (57) ABSTRACT

A system and method for measuring reactive power which uses a pair of quadrate carriers to add a 90 degree phase shift to a voltage path or a current path in a power meter. The quadrate carriers have the same frequency but are offset in phase from each other by 90 degrees.

20 Claims, 9 Drawing Sheets

SYSTEM AND METHOD FOR MEASURING REACTIVE POWER

CROSS REFERENCE TO RELATED APPLICATION

This application claims the benefit of priority to previously filed U.S. provisional patent application Ser. No. 61/102,523, filed Oct. 3, 2008, entitled SYSTEM AND METHOD FOR MEASURING REACTIVE POWER. That provisional application is hereby incorporated by reference in its entirety.

BACKGROUND INFORMATION

The present invention relates generally to measuring reactive power.

Some electrical equipment, such as computers and air conditioners, may add non-linear loads to power lines. Thus energy distributors need to measure reactive power, in addition to active power, to bill the total energy delivered. Active power and reactive power are respectively defined as:

$$\text{Active power} = U*I*\cos(\theta), \text{ and} \quad (1)$$

$$\text{Reactive power} = U*I*\sin(\theta), \quad (2)$$

where U and I are the voltage and current RMS (Root Mean Square) values respectively, and $\theta$ is the phase difference between the voltage and the current.

Figure 1:
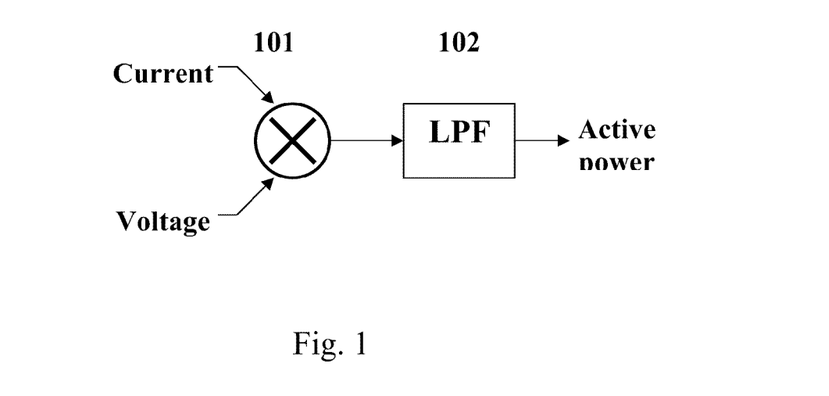
FIG. 1 illustrates a prior art system for measuring active power.
Figure 2:
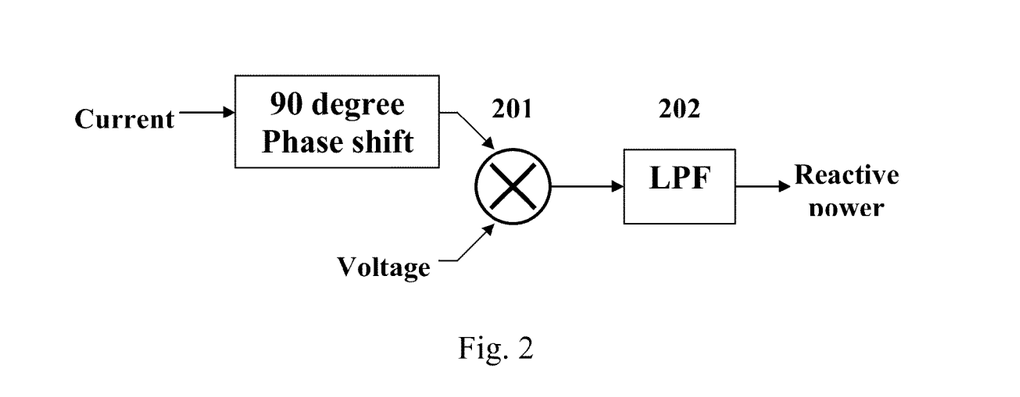
FIG. 2 illustrates a prior art system for measuring reactive power.

Equations (1) and (2) indicate that the active power and reactive power have a 90 degree phase offset, so one approach to measure reactive power is to add a 90 degree phase shift to the active power. FIG. 1 illustrates a prior art system for measuring active power. The voltage and current are multiplied at a mixer 101 and the result is filtered by a low pass filter (LPF) 102. FIG. 2 illustrates a prior art system for measuring reactive power, with a 90 degree phase shift added to the current path. The phase shifted current may be multiplied with the voltage at a multiplier 201 and the result may be filtered by a LPF 202. Alternatively, the 90 degree phase shift may be added to the voltage path.

Prior art systems use a time delay, a low-pass filter or a Hilbert transform filter to implement the 90 degree phase shifting in a power meter. The time delay method may add a T/4 delay to shift a waveform by 90 degrees, where T is the period of the waveform. Although the time delay method is simple, significant errors may be introduced to the result. Low-pass filters may add a constant 90 degree phase shift over frequency, but they are not good enough with harmonics. A Hilbert transform filter may introduce a 90 degree phase shift over any frequency including fundamental and harmonics, but it requires a dedicated process to get a constant phase shift of 90 degrees at each frequency, and maintaining a flat gain response at each frequency is not easy.

Therefore, it is desirable to provide a system and method for measuring reactive power in a simple but accurate way.

BRIEF DESCRIPTION OF THE DRAWINGS

So that features of the present invention can be understood, a number of drawings are described below. It is to be noted, however, that the appended drawings illustrate only particular embodiments of the invention and are therefore not to be considered limiting of its scope, for the invention may encompass other equally effective embodiments.

DETAILED DESCRIPTION OF EXAMPLE EMBODIMENTS

The present invention may use a pair of quadrate carriers, which have the same frequency but are offset in phase from each other by 90 degrees, to perform the 90 degree phase shifting.

Figure 3:
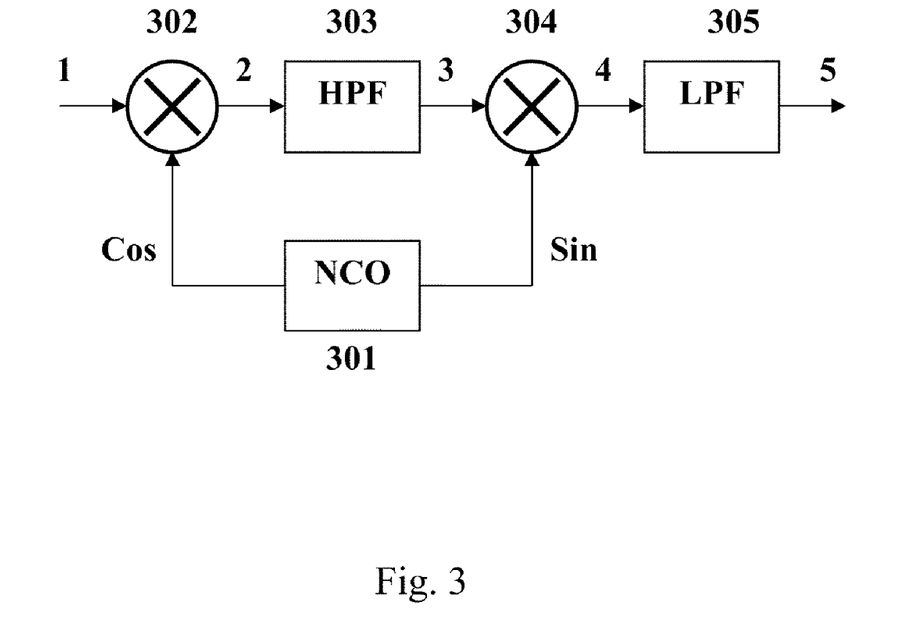
FIG. 3 illustrates a system for measuring reactive power according to one embodiment of the present invention.

FIG. 3 illustrates a system for measuring reactive power according to one embodiment of the present invention. A single-sideband (SSB) communication system may be used to modulate baseband signals, e.g., the voltage or the current in FIG. 2, to a high frequency band with one of a pair of quadrate carriers, then demodulate the high frequency band signals back to the baseband using the other one of the pair of quadrate carriers. As a result, an accurate 90 degree phase shift may be introduced at each frequency.

In one embodiment, an oscillator, e.g., a numerically controlled oscillator (NCO) 301, may be used to generate the pair of quadrate carriers which have the same frequency but a 90 degree phase offset. One of the pair of quadrate carriers may be used for the modulation and the other may be used for the demodulation.

Figure 4:
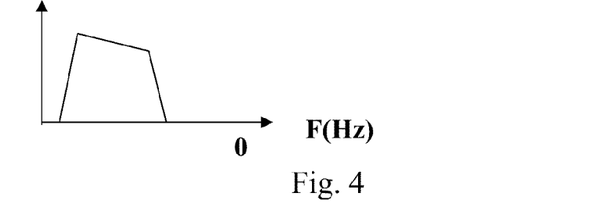
FIGS. 4-8 illustrate exemplary frequency spectrums of signals at various points in the system shown in FIG. 3.

Specifically, the input signals at Point 1 in FIG. 3 may be the voltage or current in FIG. 2, and may be located at the baseband, with a frequency spectrum shown in FIG. 4.

Figure 5:
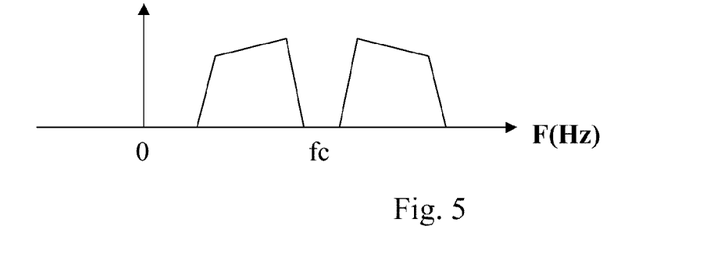

At the mixer 302, the modulation process may start. The baseband input signals may be multiplied with a transmitting carrier, e.g., a COS wave from the NCO 301, and be modulated to a high frequency band. FIG. 5 illustrates an exemplary frequency spectrum of the signal at the output of the mixer 302, or Point 2 in FIG. 3.

Figure 6:
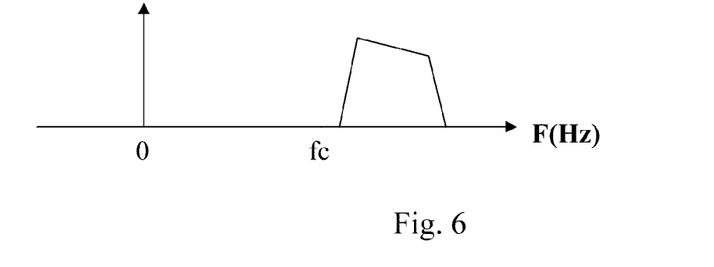

A high-pass filter (HPF) 303 may remove the lower sideband in FIG. 5. The remainder at the output of the HPF 303, or Point 3 in FIG. 3, may be the upper sideband with a frequency spectrum shown in FIG. 6. The modulation process may be finished at Point 3.

Figure 7:
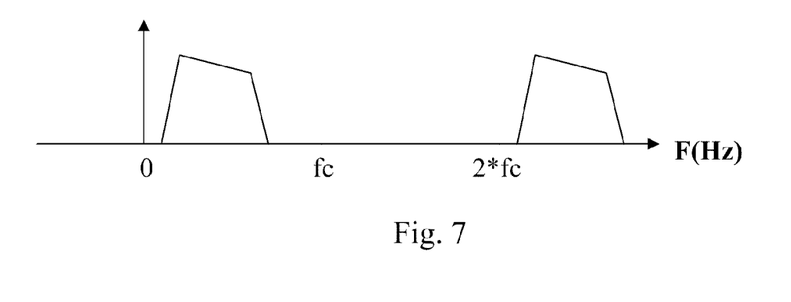

The demodulation process may start at the mixer 304. During the demodulation process, a receiving carrier, e.g., a SIN wave from the NCO 301 which has the same frequency as the transmitting carrier COS wave but a 90 degree phase offset from it, may be multiplied which the upper sideband signal from the HPF 303 at the mixer 304. Consequently, the upper sideband signals in FIG. 6 may be demodulated to the baseband and a double high frequency band. The signal at the output of the mixer 304, or Point 4 in FIG. 3, may have a frequency spectrum shown in FIG. 7.

Figure 8:
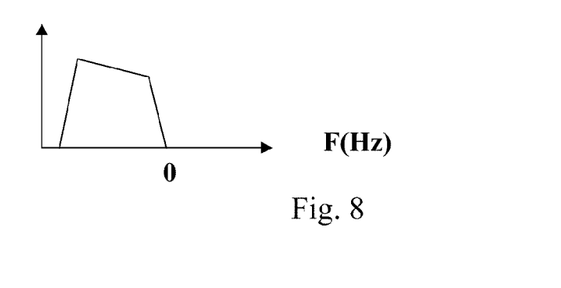

A low pass filter (LPF) 305 may be used to cut off the double high frequency band, and the final result, at Point 5 in FIG. 3, may return to the baseband, with a frequency spectrum shown in FIG. 8.

Although output signals shown in FIG. 8 look similar to the input signals shown in FIG. 4, they have been 90 degree phase shifted at each frequency, since the modulation carrier and the demodulation carrier are quadrate carriers. A triangle function demo may be used to verify the 90 degree phase shift. Assuming the input signal is a single tone, Cos(Wt), and the quadrate carriers are Cos(Vt) and Sin(Vt), the triangle function at each point in FIG. 3 may be as follows:

Point 1=Cos($Wt$);

Point 2=Cos($Wt$)*Cos($Vt$)=0.5*Cos(($W+V$)$t$)+0.5*Cos(($W-V$)$t$);

Point 3=0.5*Cos(($W+V$)$t$);

Point 4=0.5*Cos(($W+V$)$t$)*Sin($Vt$)=0.25*Sin(($W+2*V$)$t$)+0.25*Sin($-Wt$);

and

Point 5=0.25*Sin($-Wt$)=−0.25*Sin($Wt$).

The triangle functions at Point 1 and Point 5 indicate that a 90 degree phase shift is successfully introduced.

Figure 10:
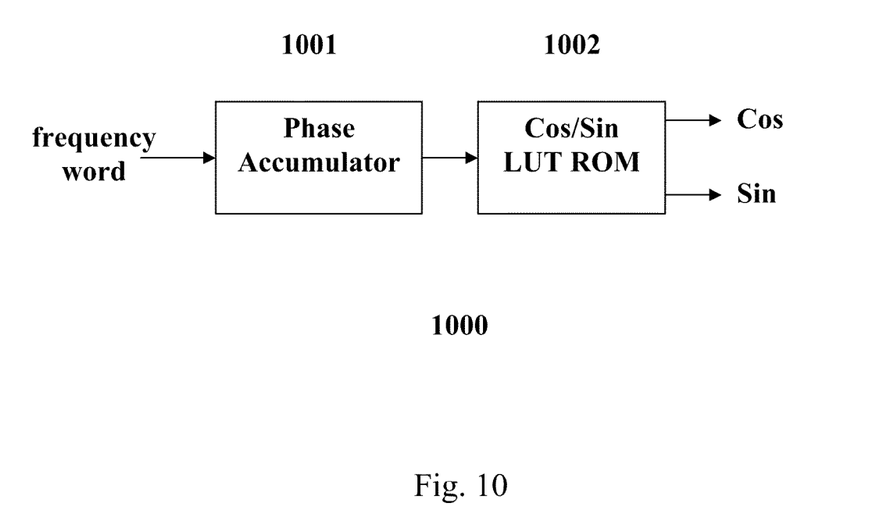
FIG. 10 illustrates a block diagram of a numerically controlled oscillator (NCO) which may be used in the system of FIG. 3.

FIG. 10 illustrates a block diagram of a currently available NCO, which may be used as the NCO 301 in FIG. 3. A NCO 1000 may have a phase accumulator 1001 for receiving a frequency word and controlling a Cos/Sin LUT ROM 1002 to output a COS wave carrier and a SIN wave carrier at a selected frequency. By changing the frequency word, the NCO 1000 may output any frequency (less than ⅓ sampling rate).

Figure 9:
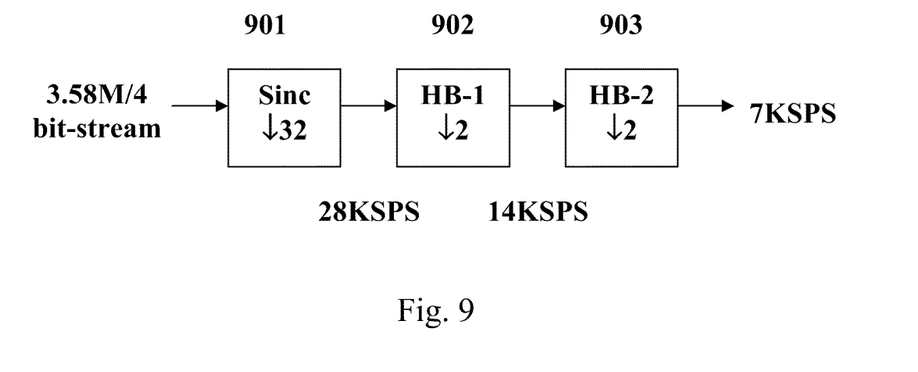
FIG. 9 illustrates an architecture for decreasing a sample rate in the system of FIG. 3.

In the system of FIG. 3, a high sample rate may mean more resource being required to implement a same function. In one embodiment, the sample rate may be 28 KSPS provided by a Sinc filter. In one embodiment, the sample rate may be 7 KSPS, with two half-band filters 902 and 903 added after a Sinc filter 901 to implement this decimeter, as shown in FIG. 9.

To further improve the efficiency of the system in FIG. 3, in one embodiment, the carrier frequency may be selected as 1/N of the sample rate, where N is an integer. Thus, a lower carrier frequency means a lower sample rate. In addition, the carrier frequency $f_c$ may need to meet the following requirement: $f_h/2 < f_c < f_h$, wherein $f_h$ is the highest baseband frequency. In one embodiment, the carrier frequency may be 700 Hz, about 1/10 of sample rate.

When the carrier frequency $f_c$ is 1/10 of the sample rate, the NCO architecture in FIG. 3 may be simplified and combined with the mixer function. The Cos-carrier may just repeat the following 10 values: 1.000, 0.8090, 0.3090, −0.3090, −0.8090, −1.0000, −0.8090, −0.3090, 0.3090. The Sin-carrier may just repeat the following 10 values: 0, 0.5878, 0.9511, 0.9511, 0.5878, 0, −0.5878, −0.9511, −0.9511, −0.5878.

Figure 11A:
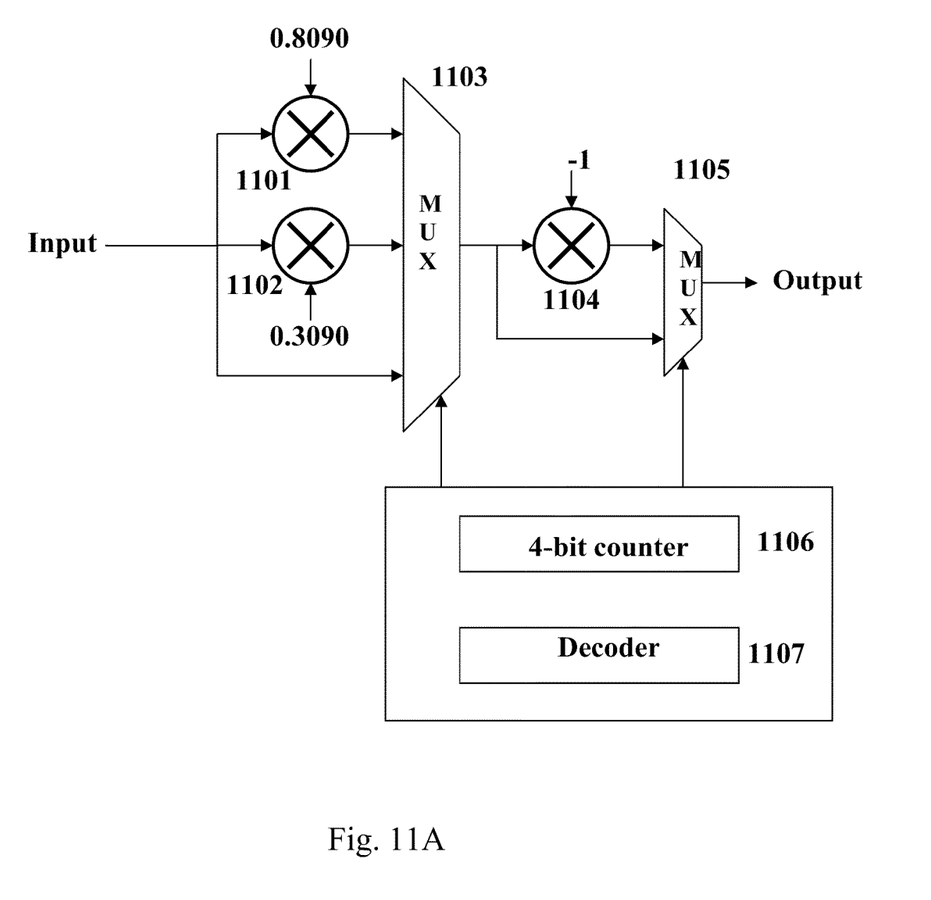
FIG. 11A illustrates a simplified combination of a modulation mixer 302 and a NCO 301 in FIG. 3 according to one embodiment of the present invention.

FIG. 11A illustrates an example of a combination of the NCO 301 and the mixer 302 when the carrier frequency $f_c$ is 1/10 of the sample rate. The Input may be the input signals at Point 1 in FIG. 3. The Input may be multiplied with 0.8090 at a mixer 1101, or with 0.3090 at a mixer 1102 before entering a multiplexer 1103, or enter the multiplexer 1103 directly. The output of the multiplexer 1103 may enter a multiplexer 1105 directly, or be multiplied with −1 first at a mixer 1104. A counter 1106 may generate a 4-bit code at each clock signal.

A decoder 1107 may decode the 4-bit code and control the multiplexers 1103 and 1105, so that the Output is a product of the Input times, one by one in sequence, one of the following numbers: 1.000, 0.8090, 0.3090, −0.3090, −0.8090, −1.0000, −0.8090, −0.3090, 0.3090.

Figure 11B:
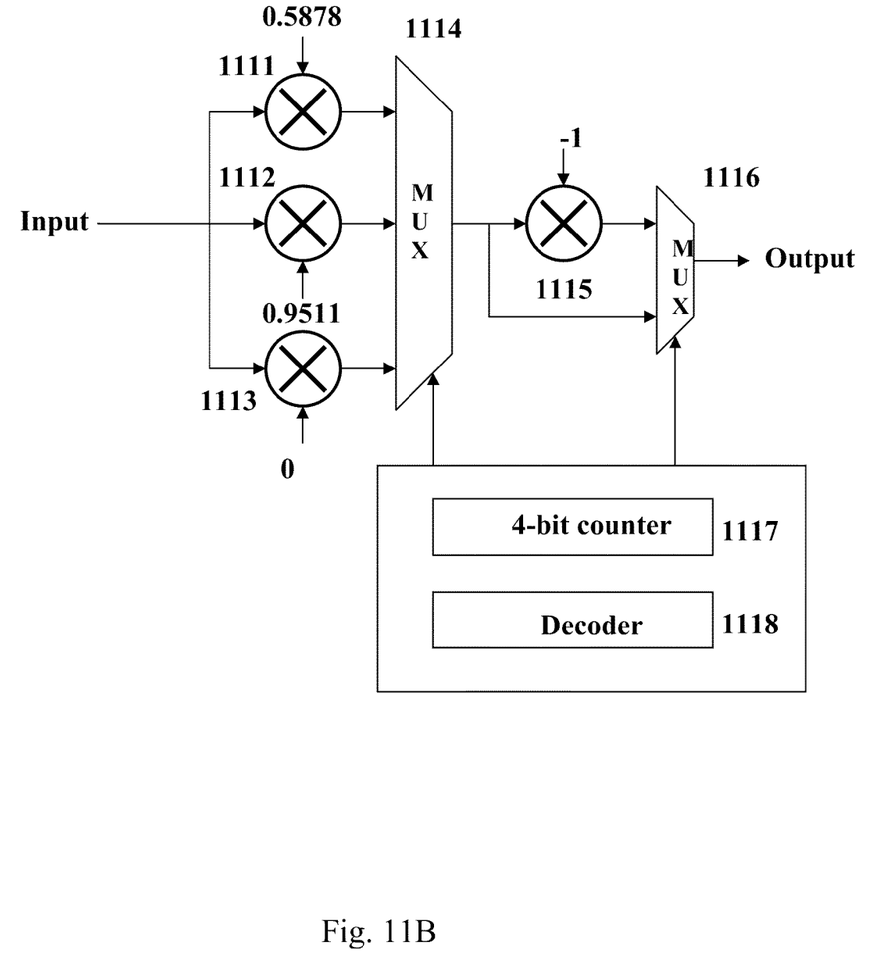
FIG. 11B illustrates a simplified combination of a demodulation mixer 304 and the NCO 301 in FIG. 3 according to one embodiment of the present invention.

Similarly, the NCO 301 may be combined with the mixer 304, as shown in FIG. 11B, When the carrier frequency $f_c$ is 1/10 of the sample rate. The Input may be the high pass filtered signal at Point 3 in FIG. 3, and may be multiplied with 0.5878 at a mixer 1111, with 0.9511 at a mixer 1112 or with 0 at a mixer 1113 before entering a multiplexer 1114. The output of the multiplexer 1114 may enter a multiplexer 1116 directly, or be multiplied with −1 first at a mixer 1115. A decoder 1118 may decode a code generated by a 4-bit counter 1117 and control the multiplexers 1114 and 1116 so that the Output is a product of the Input times, one by one in sequence, one of the following numbers: 0, 0.5878, 0.9511, 0.9511, 0.5878, 0, −0.5878, −0.9511, −0.9511, −0.5878.

The HPF 303 in FIG. 3 may be an IIR filter (e.g., a 6-order Ellipse filter) or a FIR filter (e.g., a 256 tap high-pass FIR). The LPF 305 in FIG. 3 may be an IIR filter or a FIR filter (e.g., a 256 tap low-pass FIR).

In the embodiment shown in FIG. 3, a COS wave carrier is used for the modulation and a SIN wave carrier is used for the demodulation. In another embodiment, a SIN wave carrier may be used for the modulation and a COS wave carrier may be used for the demodulation. As long as the modulation carrier and demodulation carrier are quadrate, an accurate 90 degree phase shift may be introduced in the system shown in FIG. 2.

Figure 12:
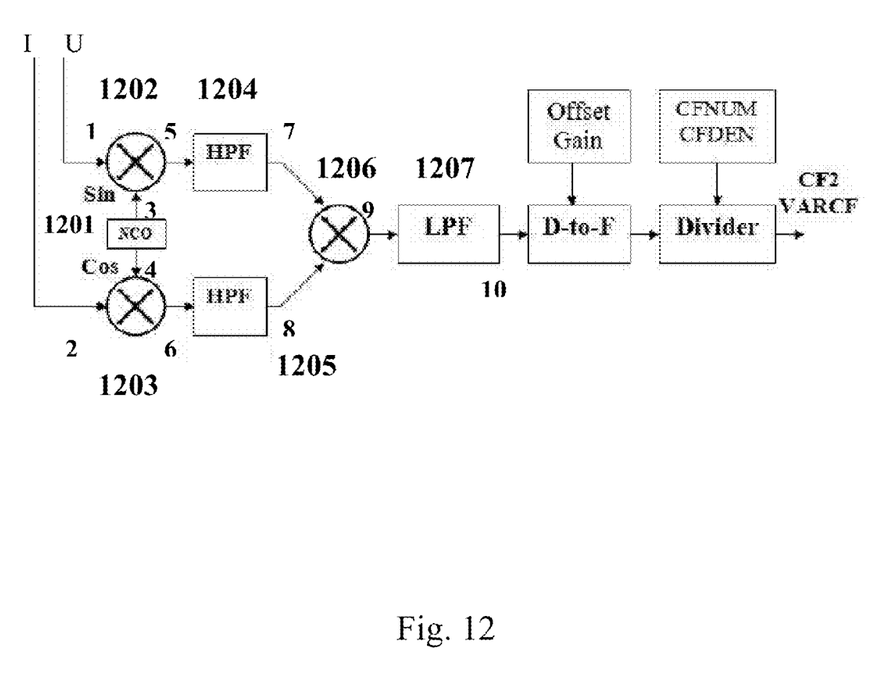
FIG. 12 illustrates a system for measuring reactive power according to an embodiment of the present invention.

FIG. 12 illustrates a system for measuring reactive power according to an embodiment of the present invention.

Instead of adding a 90 degree phase shift to either the current path or the voltage path and keeping the other path unchanged as the system in FIG. 3 does, the embodiment in FIG. 12 uses a quadrate mixer. The voltage and current are multiplied respectively with one of a pair of quadrate carriers, SIN and COS, which are out of phase by 90 degrees.

Assuming an input voltage at Point 1 in FIG. 12 is U*Cos(Wt+φu), and an input current at Point 2 in FIG. 12 is I*Cos(Wt+φi), then the reactive power should be calculated as follows:

$$VAR = 0.5 * U * I * \sin(\theta), \text{ where } \theta = \phi u - \phi i. \quad (3)$$

A pair of quadrate carriers, e.g., Sin(Vt) at Point 3 and Cos(Vt) at Point 4, may be generated by one or two NCOs 1201. At a mixer 1202, the input voltage may be multiplied with one of the quadrate carriers, e.g., the SIN wave carrier. At a mixer 1203, the input current may be multiplied with the other one of the quadrate carriers, e.g., the COS wave carrier. The results may be each high-pass filtered at HPFs 1204 and 1205 before being multiplied at a mixer 1206. The product may then be low-pass filtered at a LPF 1207.

The triangle function at each point in FIG. 12 may be as follows:

Point 5: $U*\cos(Wt+\phi u)*\sin(Vt) = 0.5*U*\sin((W+V)t+\phi u) - 0.5*U*\sin((W-V)t+\phi u)$ Point 6: $I*\cos(Wt+\phi i)*\cos(Vt) = 0.5*I*\cos((W+V)t+\phi i) + 0.5*I*\cos((W-V)t+\phi i)$ Point 7: $U*\sin((W+V)t+\phi u)$ Point 8: $I*\cos((W+V)t+\phi i)$ Point 9: $U*\sin((W+V)t+\phi u)*I*\cos((W+V)t+\phi i) = 0.5*U*I*\sin(\phi u-\phi i) + 0.5*U*I*\sin(2*(W+V)t+\phi u+\phi i))$ Point 10: $U*I*\sin(\phi u-\phi i)$ The Equation (3) and the triangle function at Point 10 may verify the 90 degree phase shift.

The LPF 1207 may be coupled to other parts in a power meter, e.g., a D-to-F, and/or a divider.

Figure 13:
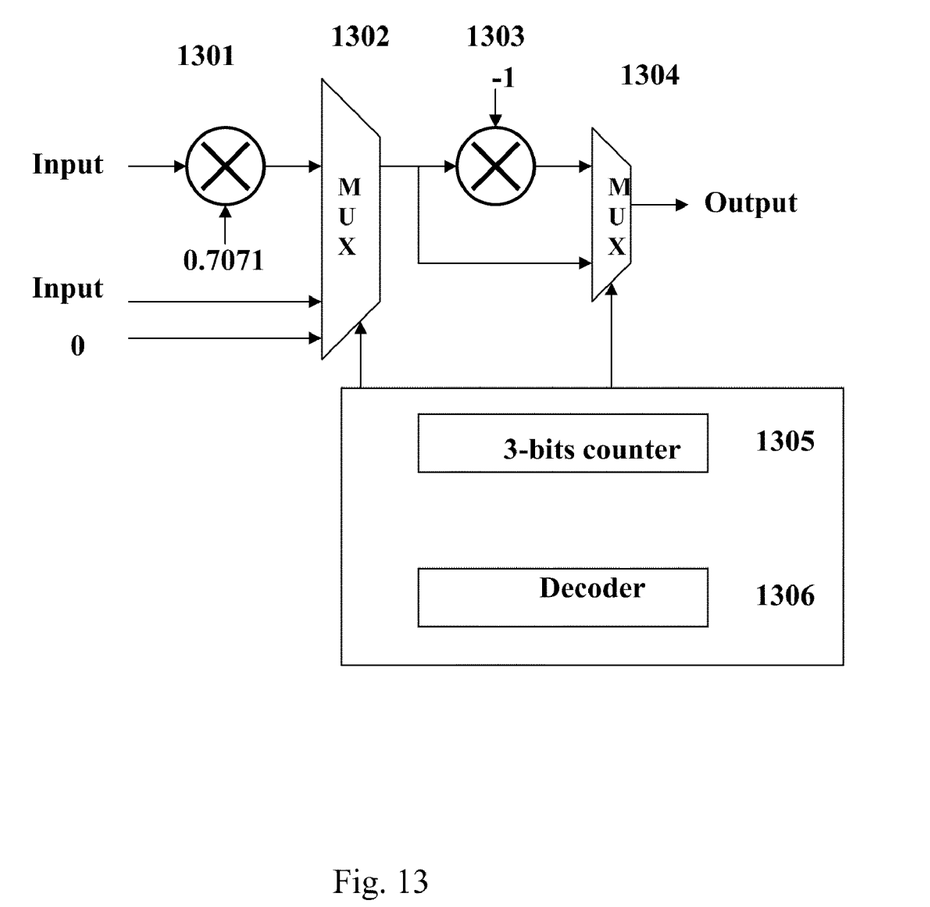
FIG. 13 illustrates a simplified combination of a NCO 1201, a mixer 1202, and a mixer 1203 in FIG. 12 according to one embodiment of the present invention.

In one embodiment, the frequency of the carriers may be fixed at ⅛ of the sample rate, so that the COS wave and SIN wave may repeat the following values: 0, +/−1, +/−0.7071. The NCO 1201 and mixers 1202 and 1203 may be combined, as shown in FIG. 13.

The Input may enter a multiplexer 1302 directly or be multiplied with 0.7071 at a mixer 1301 first. The output of the multiplexer 1302 may enter a multiplexer 1304 directly, or be multiplied with −1 first at a mixer 1303. A counter 1305 may generate a 3-bit code at each clock signal. A decoder 1306 may decode the 3-bit code and control the multiplexers 1302 and 1304 to output the following numbers in sequence: 1, 0.7071, 0, −0.7071, −1, −0.7071, 0, 0.7071. In one embodiment, the voltage is multiplied with, one by one in sequence, one of the following numbers: 1, 0.7071, 0, −0.7071, −1, −0.7071, 0, 0.7071. At the same time, the current may be multiplied with, one by one, the same sequence of numbers, but out of phase by 90 degrees, e.g., 0, −0.7071, −1, −0.7071, 0, 0.7071, 1, 0.7071.

In one embodiment, one NCO may be used to generate the SIN carrier, and another NCO may be used to generate the COS carrier.

In one embodiment, the NCO for the SIN carrier and the NCO for the COS carrier may share one counter, but their decoders may decode a same 3-bit code differently to keep the 90 degree phase difference.

In one embodiment, the sample rate may be 8 KSPS, and the carrier frequency may be 1 KHz.

Figure 14:
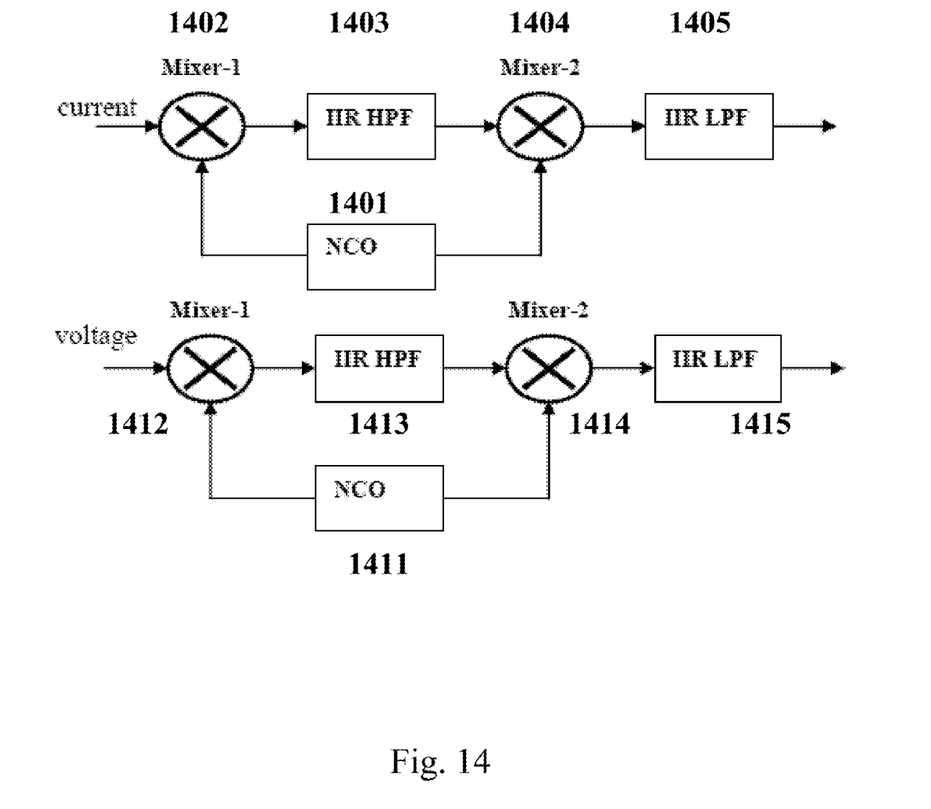
FIG. 14 illustrates a system for measuring reactive power according to an embodiment of the present invention.

FIG. 14 illustrates a system for measuring reactive power according to an embodiment of the present invention. In this embodiment, a NCO 1401 for one of the paths, e.g., the current path, may generate a pair of quadrate carriers, and provide them to a modulation mixer 1402 and a demodulation mixer 1404 respectively. At the same time, one of the quadrate carriers may be provided to both a modulation mixer 1412 and a demodulation mixer 1414 on the other path, e.g., the voltage path. The carrier for the voltage path may be provided by the NCO 1401, or generated by a separate NCO 1411. A HPF 1403 may remove the lower sideband in the modulated signal in the current path, and a HPF 1413 may remove the lower sideband in the modulated signal in the voltage path, similar to the operation shown FIGS. 5 and 6. An LPF 1405 may remove the double high frequency band in the demodulated signal in current path, and a LPF 1415 may remove the double high frequency band in the demodulated signal in voltage path, similar to the operation shown FIGS. 7 and 8. Since the modulation carrier and demodulation carrier in the current path is 90 degree phase shifted, a 90 degree phase shift may be added to the current path. However, a same carrier is used for the modulation and demodulation carrier in the voltage path, no phase shift is introduced to the voltage path.

Several features and aspects of the present invention have been illustrated and described in detail with reference to particular embodiments by way of example only, and not by way of limitation. Those of skill in the art will appreciate that alternative implementations and various modifications to the disclosed embodiments are within the scope and contemplation of the present disclosure. Therefore, it is intended that the invention be considered as limited only by the scope of the appended claims.

What is claimed is:

1. A method for measuring reactive power, comprising:
   receiving a voltage input;
   receiving a current input;
   generating a pair of quadrate carriers;
   modulating one of the voltage input and current input with one of the quadrate carriers; and
   demodulating the modulated signal with the other one of the quadrate carriers to introduce a 90 degree phase shift between the voltage input and the current input,
   wherein the pair of quadrate carriers have a same frequency but are offset in phase from each other by 90 degrees.

2. The method of claim 1, further comprising: filtering the modulated signal with a high pass filter.

3. The method of claim 1, further comprising: filtering the demodulated signal with a low pass filter.

4. The method of claim 1, wherein the quadrate carriers comprise a SIN carrier and a COS carrier.

5. The method of claim 1, further comprising: using 7 KSPS as a sample rate.

6. The method of claim 5, wherein the frequency of the quadrate carriers is 1/N of the sample rate, and wherein N is an integer.

7. The method of claim 6, further comprising: using a sequence of numbers to represent one of the quadrate carriers.

8. A method for measuring reactive power, comprising:
   receiving a voltage input;
   receiving a current input;
   generating a pair of quadrate carriers;
   modulating one of the voltage input and current input with one of the quadrate carriers; and
   modulating the other one of the voltage input and current input with the other one of the quadrate carriers to introduce a 90 degree phase shift between the voltage input and the current input,
   wherein the pair of quadrate carriers have a same frequency but are offset in phase from each other by 90 degrees.

9. The method of claim 8, wherein the quadrate carriers comprise a SIN carrier and a COS carrier.

10. An apparatus for measuring reactive power, comprising:
    at least one carrier generator for generating a pair of quadrate carriers;
    a modulator for modulating one of a voltage input and a current input with one of the quadrate carriers; and
    a demodulator for demodulating the modulated input with the other one of the quadrate carriers to introduce a 90 degree phase shift between the voltage input and the current input, wherein the pair of quadrate carriers have a same frequency but are offset in phase from each other by 90 degrees.

11. The apparatus of claim 10, further comprising: a high pass filter for filtering the modulated signal before the demodulating.

12. The apparatus of claim 10, further comprising: a low pass filter for filtering the demodulated signal.

13. The apparatus of claim 10, further comprising: a half-band filter for decreasing a sample rate for the modulating.

14. The apparatus of claim 10, wherein a combination of the carrier generator and the modulator comprises:
    a first multiplier for multiplying an input with a first predetermined value;
    a first multiplexer for receiving an output of the first multiplier and the input;
    a second multiplier for multiplying an output of the first multiplexer with a second predetermined value;
    a second multiplexer coupled to the second multiplier;

a counter for generating a code; and a decoder for decoding the code to control the first multiplexer and the second multiplexer to output a sequence of numbers.

15. The apparatus of claim 14, wherein the sequence of numbers represent one of the quadrate carriers.

16. The apparatus of claim 10, wherein the carrier generator is an oscillator.

17. The apparatus of claim 16, wherein the carrier generator is a numerically controlled oscillator (NCO).

18. An apparatus for measuring reactive power, comprising:

at least one carrier generator for generating a pair of quadrate carriers;

a first modulator for modulating one of a voltage input and a current input with one of the quadrate carriers; and a second modulator for modulating the other one of the voltage input and the current input with the other one of the quadrate carriers to introduce a 90 degree phase shift between the voltage input and the current input, wherein the pair of quadrate carriers have a same frequency but are offset in phase from each other by 90 degrees.

19. The apparatus of claim 18, wherein the carrier generator is an oscillator.

20. The apparatus of claim 19, wherein the carrier generator is a numerically controlled oscillator (NCO).

* * * * *